United States Patent
Wu et al.

(10) Patent No.: US 8,975,631 B2
(45) Date of Patent: Mar. 10, 2015

(54) ARRAY SUBSTRATE, MANUFACTURING METHOD, AND DISPLAY DEVICE THEREOF

(71) Applicant: Beijing BOE Optoelectronics Technology Co., Ltd., Beijing (CN)

(72) Inventors: Hao Wu, Beijing (CN); Yajuan Chen, Beijing (CN); Yanyan Yin, Beijing (CN); Lei Wang, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 14/127,935

(22) PCT Filed: Dec. 23, 2012

(86) PCT No.: PCT/CN2012/087235
§ 371 (c)(1),
(2) Date: Dec. 19, 2013

(87) PCT Pub. No.: WO2014/015636
PCT Pub. Date: Jan. 30, 2014

(65) Prior Publication Data
US 2014/0346511 A1   Nov. 27, 2014

(30) Foreign Application Priority Data

Jul. 27, 2012  (CN) .......................... 2012 1 0265530

(51) Int. Cl.
*H01L 27/02*   (2006.01)
*G02F 1/1362*  (2006.01)
*H01L 27/12*   (2006.01)

(52) U.S. Cl.
CPC ...... *G02F 1/136286* (2013.01); *H01L 27/1214* (2013.01); *G02F 2001/136254* (2013.01)
USPC ................ 257/59; 257/72; 257/291; 257/292

(58) Field of Classification Search
CPC ............ H01L 27/0617; H01L 27/0623; H01L 27/0629; H01L 27/0635; G02F 1/136227
USPC .............................. 257/59, 72, 291, 292, 294
See application file for complete search history.

(56) References Cited

U.S. PATENT DOCUMENTS

2002/0074549 A1* 6/2002 Park et al. ........................ 257/59
2009/0179202 A1* 7/2009 Hong et al. ...................... 257/59

FOREIGN PATENT DOCUMENTS

CN           102790051 A    11/2012

OTHER PUBLICATIONS

International Search Report for International Application No. PCT/CN2012/087235 issued Jun. 16, 2013, 14pgs.

*Primary Examiner* — Shaun Campbell
*Assistant Examiner* — Raj R Gupta

(57) ABSTRACT

An array substrate, a manufacturing method, and a display device thereof are disclosed. The array substrate comprises a plurality of pixel units, each of the pixel units comprises a first transparent conductive layer and a second transparent conductive layer (2), the first transparent conductive layer forms a pixel electrode (1), the second transparent conductive layer (2) forms a common electrode (201), and the second transparent conductive layer (2) is disposed on a surface of the pixel unit, an insulating protective layer (131) is provided between the first transparent conductive layer and the second transparent conductive layer (2); wherein a detecting portion (102) is extended from the pixel electrode (1) of each pixel unit; a detecting plate (202) corresponding to the detecting portion (102) is formed of the second transparent conductive layer (2), the detecting plate (202) and the common electrode (201) are transversely separated from each other, and a portion of the insulating protective layer (131) located between the detecting plate (202) and the detecting portion (102) is provided with at least one via hole (3), through which the detecting plate (202) is electrically connected with the detecting portion (201). With the array substrate, the pixel electrode (1) of each pixel unit can be detected individually, thereby improving the detection accuracy.

12 Claims, 3 Drawing Sheets

ARRAY SUBSTRATE, MANUFACTURING METHOD, AND DISPLAY DEVICE THEREOF

CROSS REFERENCE TO RELATED APPLICATIONS

This application is based on International Application No. PCT/CN2012/087235 filed on Dec. 23, 2012, which claims priority to Chinese National Application No. 201210265530.X filed on Jul. 27, 2012, the contents of which are incorporated herein by reference.

TECHNICAL FIELD

Embodiments of the invention relate to a liquid crystal display technology, in particular an array substrate, a manufacturing method, and a display device thereof.

BACKGROUND

In the field of liquid crystal display technology, an Advanced Super Dimension Switching (AD-SDS or ADS) type array substrate is widely used as it has advantages of a wide viewing angle, etc. ADS technology is to generate a multi-dimensional electric field with both an electric field produced at edges of slit electrodes in the same plane and an electric field produced between a slit electrode layer and a plate-shaped electrode layer, so that liquid crystal molecules at all directions, which are located directly over the electrodes and between the slit electrodes in a liquid crystal cell, can be rotated, which enhances the work efficiency of liquid crystals and increases light transmittance. The ADS technology can improve the picture quality of thin film transistor liquid crystal displays (TFT-LCDs) and has advantages of high resolution, high transmittance, low power consumption, wide viewing angle, high aperture ratio, low chromatic aberration, being free of push Mura, etc.

In conventional technology, ADS type array substrate comprises a plurality of pixel units, as shown in FIGS. 1 and 2, in each of the pixel units, a glass substrate 09 is fabricated with a gate line 05 made of gate material, over which a gate insulation layer 03 is deposited, an active layer 07 of a predetermined pattern is disposed over the gate insulation layer 03, and a source/drain electrode metal layer, which is used for fabricating a source electrode 08 and a drain electrode 010 of a predetermined pattern, is provided over the active layer 07; a first transparent conductive layer, which is used for fabricating a pixel electrode 01 (i.e. a plate-shaped electrode), is disposed over the above source/drain electrode metal layer, a passivation layer 04 is deposited over the first transparent conductive layer, and a second transparent conductive layer for fabricating common electrodes 02 (i.e. slit electrode) is disposed over the passivation layer 04, wherein a plurality of slits are formed between the common electrodes 02.

A LCD panel has a plurality of pixel units in an imaging region of the LCD panel, and the pixel electrode 01 located in display region of each pixel unit is covered by a multilayer structure subsequently fabricated, and thus it is impossible to make a detection for TFT semiconductor characteristics prior to cutting the substrate. Therefore, in conventional technology, a liquid crystal panel is provided with dedicated detection modules at edges of the whole liquid crystal panel (i.e., non-display region) for the sake of detecting. These detection modules are fabricated together with the respective layers in the display region, but the modules only have the pixel electrode layer and the layers beneath, while the multilayer structures over the pixel electrode are not fabricated, so the pixel electrode of these detection modules may be detected by means of a detecting device. Both the pixel electrode of the detection modules and the pixel electrode of the pixel units are supplied with the same parameters during the detection, such as voltage, current, etc. The semiconductor characteristics of the pixel electrode in other pixel units can be deduced by detecting the semiconductor characteristics of the pixel electrode of detection modules.

However, due to the resistance difference between the detection modules and each the pixel unit, the detection result obtained by detecting the pixel electrode of detection modules are much different from the actual characteristics of the pixel electrode of each pixel unit, which is detrimental to an in-depth analysis and investigation of the TFT, and even sometimes it is impossible to exactly know how would be the actual work situation of the designed TFT, which resulting in a potential risk of great uncertainty.

Therefore, a technical problem to be solved by one skilled in the art is how to provide an array substrate so as to improve the detection accuracy for the pixel electrode in each individual pixel unit.

SUMMARY

The present invention provides an array substrate, in which the pixel electrode of each pixel unit can be detected individually, thereby improving the detection accuracy for the pixel electrode in each individual pixel unit.

To achieve the above mentioned object, embodiments of the present invention provide the following solutions:

According to a first aspect of the present invention, there is provided an array substrate comprising a plurality of pixel units, each of the pixel units comprises a first transparent conductive layer and a second transparent conductive layer, the first transparent conductive layer forms a pixel electrode, the second transparent conductive layer forms a common electrode, and the second transparent conductive layer is disposed on a surface of the pixel unit, an insulating protective layer is provided between the first transparent conductive layer and the second transparent conductive layer; wherein a detecting portion is extended from the pixel electrode of each pixel unit; a detecting plate corresponding to the detecting portion is formed of the second transparent conductive layer, the detecting plate and the common electrode are transversely separated from each other; and a portion of the insulating protective layer located between the detecting plate and the detecting portion is provided with at least one via hole, through which the detecting plate is electrically connected with the detecting portion.

According to a second aspect of the present invention, there is provided an array substrate comprising a plurality of pixel units, each of the pixel units comprises:

a substrate;

a data line, a source electrode and a drain electrode formed on the substrate, the source electrode is electrically connected with an adjacent data line;

a first insulating layer formed on the substrate and in a channel between the source electrode and the drain electrode;

an active layer with a predetermined pattern formed on the source electrode and the drain electrode;

a second insulating layer formed on the data line and the active layer, the second insulating layer has a through hole;

a pixel electrode formed on the second insulating layer, the pixel electrode is electrically connected with the drain electrode by the through hole in the second insulating layer, wherein a detecting portion extended from the pixel electrode is disposed over the data line;

a first insulating protective layer formed on the second insulating layer, the first insulating protective layer and the pixel electrode are disposed in the same layer;

a gate electrode layer formed on the first insulating protective layer;

a second insulating protective layer formed on the gate electrode layer and the pixel electrode, the second insulating protective layer has at least one via hole;

a common electrode and a detecting plate formed on the second insulating protective layer, the detecting plate is electrically connected with the detecting portion by the at least one via hole provided in the second insulating protective layer.

According to a third aspect of the present invention, there is further provided a display device comprising any one of the above array substrates.

According to a fourth aspect of the present invention, there is provided a manufacturing method of an array substrate, the method comprises:

fabricating a source/drain electrode metal layer on a substrate, forming a pattern of a source electrode and a drain electrode, and forming a pattern of a data line;

fabricating a first insulating layer on the source/drain electrode metal layer, and forming a pattern of the first insulating layer;

fabricating an active layer on the source/ drain electrode metal layer;

fabricating a second insulating layer on the active layer;

fabricating a through hole in the second insulating layer at a position corresponding to the drain electrode;

fabricating a first transparent conductive layer on the second insulating layer and forming a pattern of the pixel electrode, the pixel electrode is electrically connected with the drain electrode by the through hole in the second insulating layer, and a detecting portion is extended from the pixel electrode;

depositing a first insulating protective layer on the second insulating layer;

fabricating a gate electrode layer on the first insulating protective layer and forming a pattern of a gate line;

depositing a second insulating protective layer on the gate electrode layer;

fabricating a via hole in the second insulating protective layer at a position corresponding to the data line;

fabricating a second transparent conductive layer on the second insulating protective layer, and forming a pattern of the common electrode and an elongated detecting plate, the detecting plate is electrically connected with the detecting portion by the via hole provided in the second insulating protective layer.

In the array substrate provided by the embodiments of the present invention, a detecting point of the pixel electrode is guided to the surface of array substrate by connecting the detecting portion with the detecting plate of the second transparent conductive layer through the via hole. In a specific detection process, the semiconductor characteristics of the pixel electrode in a display region of the pixel unit can be easily obtained by detecting the detecting plate in the detecting region of each pixel unit using a detecting device.

Therefore, in the array substrate according to the embodiments of the present invention, the pixel electrode of each pixel unit can be detected individually, thereby improving the detection accuracy for the pixel electrode in each individual pixel unit.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention more apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationships, and when the position of the object which is described is changed, the relative position relationship may be changed accordingly.

Figure 1:
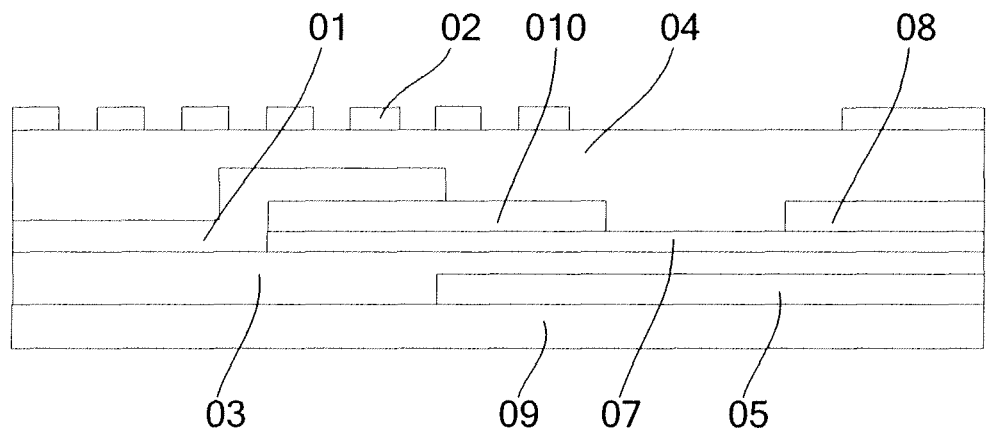
FIG. 1 is a cross-sectional view of a display region of one pixel unit in a conventional ADS type array substrate.
Figure 2:
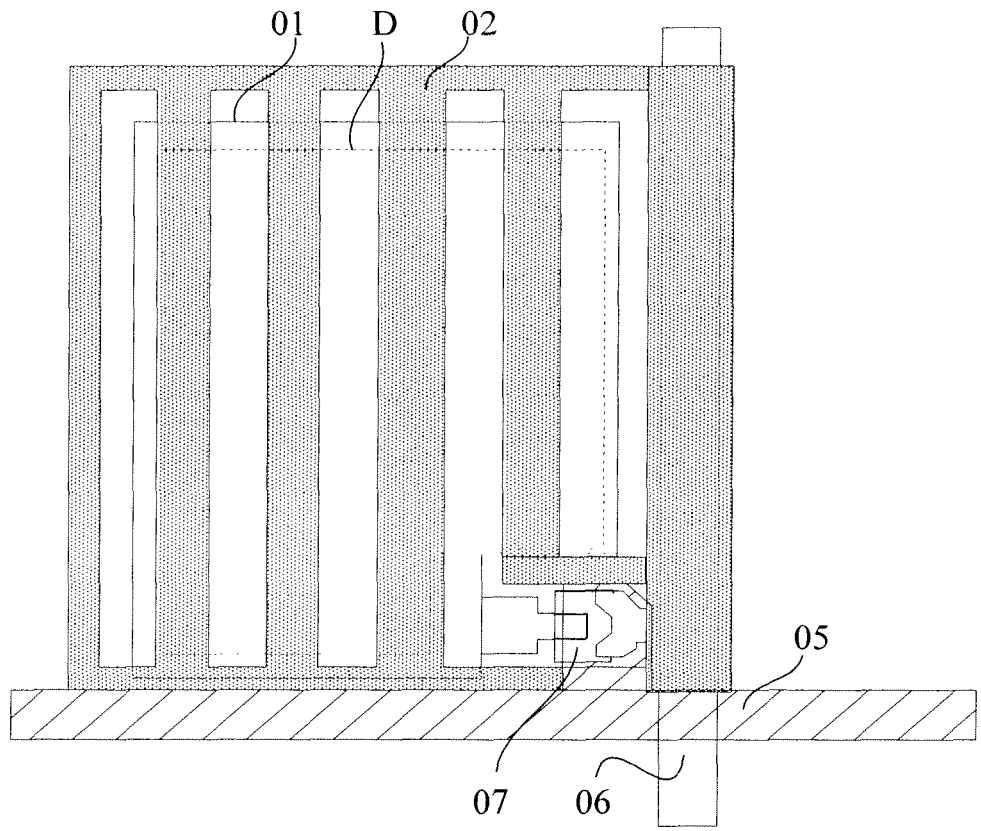
FIG. 2 is a schematic plan view of a pixel unit in a conventional array substrate.
Figure 3:
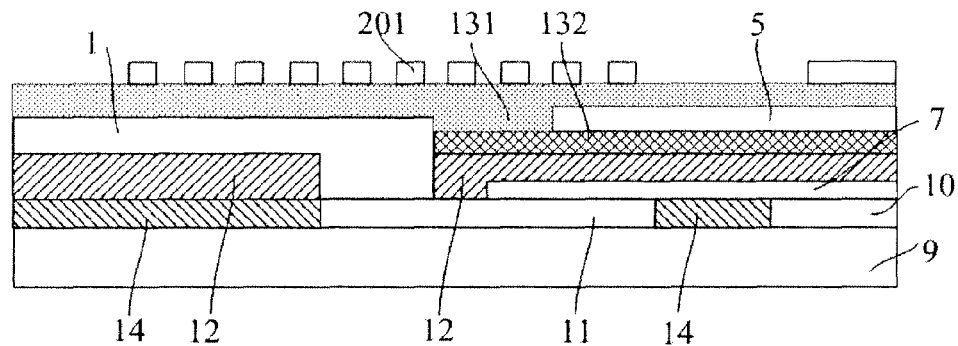
FIG. 3 is a cross-sectional view of a display region of a pixel unit in an ADS type array substrate according to an embodiment of the present invention.
Figure 4:
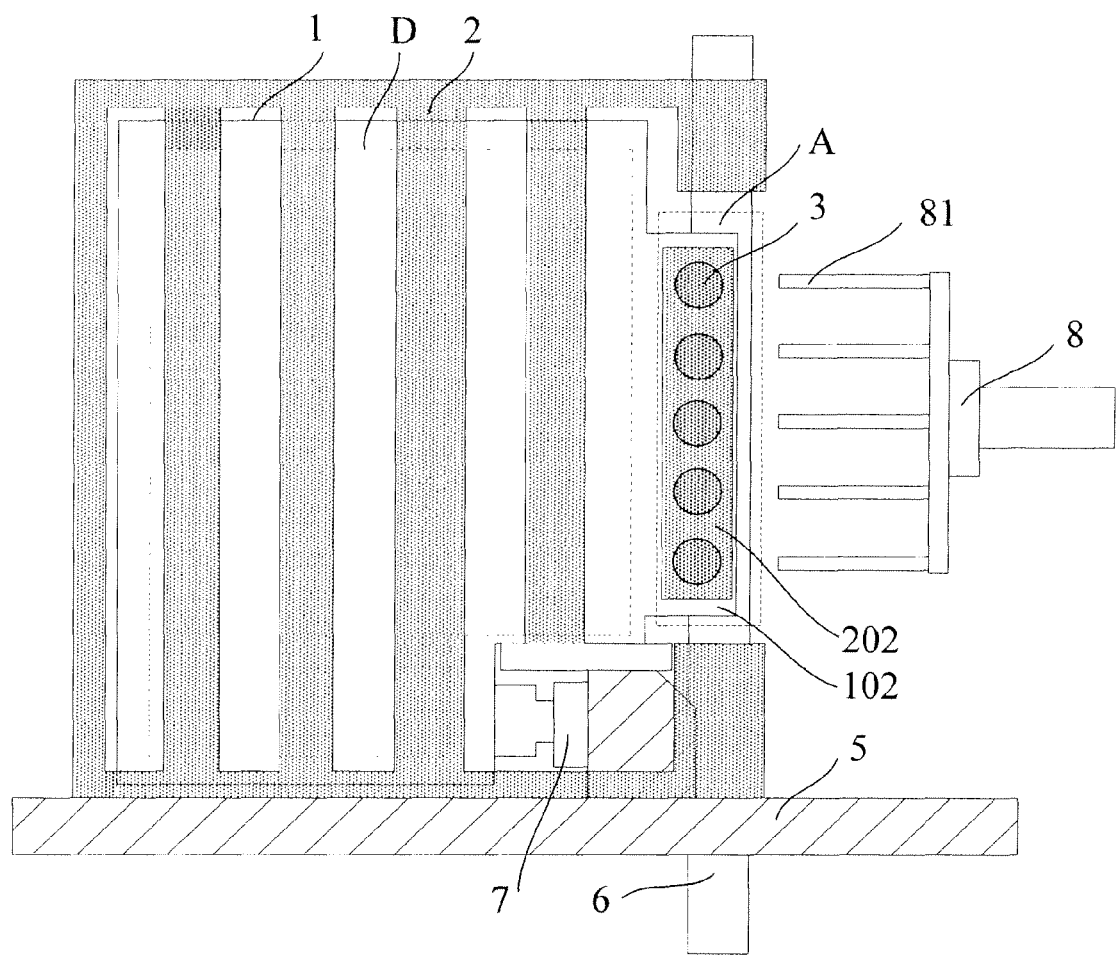
FIG. 4 is a schematic plan view of a pixel unit in an array substrate according to an embodiment of the present invention.

An array substrate according to an embodiment of the present invention comprises a plurality of pixel units, as shown in FIGS. 3 and 4, each pixel unit comprises a first transparent conductive layer and a second transparent conductive layer, wherein the first transparent conductive layer forms a pixel electrode 1, the second transparent conductive layer 2 forms a common electrode 201. The second transparent conductive layer 2 is disposed on the surface of the pixel units, and an insulating protective layer 131 is provided between the first transparent conductive layer and the second transparent conductive layer, so that both of them are insulated from each other. In the accompanying figures herein, the dotted lines represent invisible portions, the solid lines represent visible portions. Each pixel unit has a detecting region, such as a detecting region "A" shown in FIG. 4. The pixel electrode 1 comprises a detecting portion 102 extended to the detecting region A, while the second transparent conductive layer 2 forms an elongated detecting plate 202 corresponding to the detecting portion in the detecting region A. The detecting plate 202 and the common electrode 201 are transversely separated from each other, and the portion of the insulating protective layer between the detecting plate 202 and the detecting portion 102 is provided with at least one via hole 3, through which the detecting plate 202 is electrically connected with the detecting portion 102, as shown in FIG. 4.

As shown in FIGS. 3 and 4, in this embodiment, the common electrode 201 is a slit-shaped transparent electrode, the pixel electrode 1 is a plate-shaped transparent electrode.

In the array substrate of the embodiment according to the present invention, a detecting point of the pixel electrode 1 is guided to the surface of array substrate through the via holes 3 between the detecting portion 102 and the detecting plate 202 of the second transparent conductive layer 2. During the detection, the detecting plate 202 in the detecting region A of each pixel unit may be detected by a probe 81 of a detecting device 8, so as to obtain the semiconductor characteristics of the pixel electrode 1 in a display region D (an area as indicated by dotted lines) of the pixel unit.

Accordingly, in the array substrate of the present invention, the pixel electrode 1 of each pixel unit can be detected individually, which can increase the detection accuracy for the pixel electrode 1 in each individual pixel region.

Furthermore, in order to ensure the stability of electrical connection between the detecting plate 202 and the detecting portion 102, the number of the above-mentioned via holes in the insulating protective layer 131 between the detecting plate 202 and the detecting portion 102 is set to be at least two. The at least two via holes can avoid an undesired virtual connection in the electrical connection between the detecting plate 202 and the detecting portion 102. That is, as long as one of the at least two via holes 3 is connected well, the electrical connection between the detecting plate 202 and the detecting portion 102 can be ensured.

Figure 5:
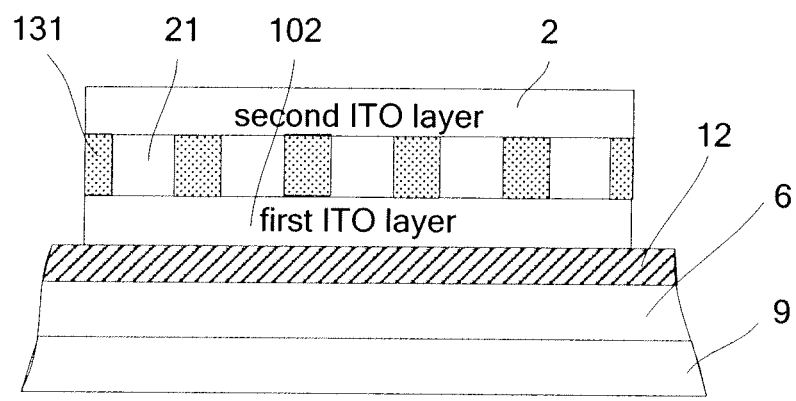
FIG. 5 is a cross-sectional view of a detecting area of a pixel unit in an array substrate according to an embodiment of the present invention.

As shown in FIGS. 4 and 5, the via hole 3 is filled with a connecting portion 21 made of conductive material (e.g., ITO). The connecting portion 21 may be formed separately, or may be integrally formed with the detecting portion 102 and the detecting plate 202. The latter is preferable, because such integrated structure can increase the stability of electrical connection between the detecting plate 202 and the detecting portion 102.

In an embodiment, the detecting region A is preferably not overlapped with the display region D of each pixel unit. As the detecting region A and the display region D shown in FIG. 4, the detecting portion 102 and the detecting plate 202 are located outside of the display region D of pixel unit, which can prevent the detecting region A from influencing the display region D, so as to ensure the display effect of each pixel unit in the array substrate.

Preferably, the pixel unit of the above array substrate comprises a thin film transistor, and the thin film transistor is of a top-gate type.

Referring to FIGS. 3 and 4, according to another embodiment of the present invention, there is provided an ADS array substrate comprising a plurality of pixel units, wherein each of the pixel units comprises:

a data line 6, a source electrode 10 and a drain electrode 11 formed on a substrate 9, wherein the source electrode 10 is electrically connected with an adjacent data line 6;

a first insulating layer 14 formed on the substrate 9 and in a channel between the source electrode 10 and the drain electrode 11;

an active layer 7 of a predetermined pattern formed on the source electrode 10 and the drain electrode 11;

a second insulating layer 12 formed on the data line 6 and the active layer 7, the second insulating layer 12 has a through hole;

a pixel electrode 1 formed on the second insulating layer 12, the pixel electrode 1 is electrically connected with the drain electrode 11 by the through hole of the second insulating layer 12, wherein a detecting portion 102 extended from the pixel electrode 1 is disposed over the data line 6;

a first insulating protective layer 132 formed on the second insulating layer 12, the first insulating protective layer 132 and the pixel electrode 1 are disposed in the same layer;

a gate electrode layer 5 formed on the first insulating protective layer 132;

a second insulating protective layer 131 formed on the gate electrode layer 5 and the pixel electrode 1, and the second insulating protective layer 131 has at least one via hole 3;

a common electrode 201 and a detecting plate 202 formed on the second insulating protective layer 131, the detecting plate 202 is electrically connected with the detecting portion 102 by a connection portion 21 in at least one via hole 3 provided in the second insulating protective layer 131.

In the above technical solution, a gate electrode layer 5 is located between the first insulating protective layer 132 and the second insulating protective layer 131, so as to insulate the gate electrode layer 5 with the pixel electrode 1, the data line 6 and the like. The pixel electrode 1 formed by a first transparent conductive layer and the detecting portion 102 extended from the pixel electrode 1 are located under the second insulating protective layer 131. The common electrode 201 formed by the second transparent conductive layer 2 and the detecting plate 202 corresponding to the detecting portion 102 are located over the second insulating protective layer 131, and the detecting portion 102 is electrically connected with the detecting plate 202 by the connection portion 21 filled in the via hole 3 formed in the second insulating protective layer 131. Therefore, in the above mentioned array substrate, the detecting point of the pixel electrode 1 is guided to the surface of array substrate by connecting the detecting portion 102 with the detecting plate 202 of the second transparent conductive layer 2 through the via hole 3 therebetween. In a specific detection process, the semiconductor characteristics of the pixel electrode 1 in a display region D of the pixel unit can be easily obtained by detecting the detecting plate 202 in the detecting region A of each pixel unit using the probe 81 of the detecting device 8.

Preferably, in an embodiment, the first transparent conductive layer and the second transparent conductive layer 2 are fabricated with the same material. As the first transparent conductive layer and the second transparent conductive layer 2 are of the same material, the resistance between the detecting portion 102 of the pixel electrode 1 and the detecting plate 202 formed by the second transparent conductive layer 2 is lower, which further enhances the detection accuracy for the pixel electrode 1.

More preferably, in an embodiment, the first transparent conductive layer is of a plate-shaped structure fabricated by indium tin oxide. That is to say, the materials of both the first transparent conductive layer and the second transparent conductive layer 2 are indium tin oxide.

According to a further embodiment of the present invention, there is provided a display device including any of the above-mentioned array substrate. The display device may be a liquid crystal panel, E-paper, OLED panel, liquid crystal television, LCD, digital photo frames, mobile phones, tablet PC and other products or parts with display functions.

According to another embodiment of the present invention, there is provided a manufacturing method of an array substrate, the method comprises:

fabricating a source/drain electrode metal layer on a substrate 9, forming a pattern of the source electrode 10 and a drain electrode 11, and forming a pattern of the data line 6;

fabricating a first insulating layer 14 on the source/drain electrode metal layer, and forming a pattern of the first insulating layer 14;

fabricating an active layer 7 on the source/drain electrode metal layer;

fabricating a second insulating layer 12 on the active layer 7;

fabricating a through hole in the second insulating layer 12 at a position corresponding to the drain electrode 11;

fabricating a first transparent conductive layer on the second insulating layer 12 and forming a pattern of the pixel electrode 1, the pixel electrode 1 is electrically connected with the drain electrode 11 by the through hole in the second insulating layer 12, and a detecting portion 102 is extended from the pixel electrode 1;

depositing a first insulating protective layer 132 on the second insulating layer 12;

fabricating a gate electrode layer 5 on the first insulating protective layer 132 and forming a pattern of a gate line;

depositing a second insulating protective layer 131 on the gate electrode layer 5 uniformly;

fabricating a via hole 3 in the second insulating protective layer 131 at a position corresponding to the data line 6;

fabricating a second transparent conductive layer 2 on the second insulating protective layer 131, and forming a pattern of the common electrode 201 and an elongated detecting plate 202, the detecting plate 202 is electrically connected with the detecting portion 102 by the via hole 3 provided in the second insulating protective layer 131.

In the array substrate manufactured by the above method, a gate electrode layer 5 is located between the first insulating protective layer 132 and the second insulating protective layer 131, so as to insulate the gate electrode layer 5 with the pixel electrode 1, the data line 6 and the like. The pixel electrode 1 formed by a first transparent conductive layer and the detecting portion 102 extended from the pixel electrode 1 are located under the second insulating protective layer 131. The common electrode 201 formed by the second transparent conductive layer 2 and the detecting plate 202 corresponding to the detecting portion 102 are located over the second insulating protective layer 131, and the detecting portion 102 is electrically connected with the detecting plate 202 by the connection portion 21 filled in the via hole 3 formed in the second insulating protective layer 131. Therefore, in the above mentioned array substrate, the detecting point of the pixel electrode 1 is guided to the surface of array substrate by connecting the detecting portion 102 with the detecting plate 202 of the second transparent conductive layer 2 through the via hole 3 therebetween. In a specific detection process, the semiconductor characteristics of the pixel electrode 1 in a display region D of the pixel unit can be easily obtained by detecting the detecting plate 202 in the detecting region A of each pixel unit using the probe 81 of the detecting device 8.

What are described above is related to the illustrative embodiments of the disclosure only and not limitative to the scope of the disclosure; the scopes of the disclosure are defined by the accompanying claims.

The invention claimed is:

1. An array substrate comprising a plurality of pixel units, each of the pixel units comprises a first transparent conductive layer and a second transparent conductive layer, the first transparent conductive layer forms a pixel electrode, the second transparent conductive layer forms a common electrode, and the second transparent conductive layer is disposed on a surface of the pixel unit, an insulating protective layer is provided between the first transparent conductive layer and the second transparent conductive layer; wherein a detecting portion is extended from the pixel electrode of each pixel unit; a detecting plate corresponding to the detecting portion is formed of the second transparent conductive layer, the detecting plate and the common electrode are transversely separated from each other; and a portion of the insulating protective layer located between the detecting plate and the detecting portion is provided with at least one via hole, through which the detecting plate is electrically connected with the detecting portion.

2. The array substrate according to claim 1, wherein, the number of the via hole is at least two.

3. The array substrate according to claim 2, wherein the via hole is filled with a connecting portion, which is integrally formed with the detecting plate.

4. The array substrate according to claim 1, wherein the detecting portion and the detecting plate are located outside of a display region of the pixel unit.

5. The array substrate according to claim 1, wherein the pixel unit is provided with a thin film transistor and the thin film transistor is of a top-gate type.

6. The array substrate according to claim 1, wherein the common electrode is a slit-shaped transparent electrode; the pixel electrode is a plate-shaped transparent electrode.

7. The array substrate according to claim 1, wherein the first transparent conductive layer and the second transparent conductive layer are fabricated with the same material.

8. The array substrate according to claim 1, wherein the detecting portion and the detecting plate are located outside of a display region of the pixel unit.

9. A display device, comprising the array substrate according to claim 1.

10. An array substrate, comprising a plurality of pixel units, each of the pixel units comprises:
a substrate;
a data line, a source electrode and a drain electrode formed on the substrate, the source electrode is electrically connected with an adjacent data line;
a first insulating layer formed on the substrate and in a channel between the source electrode and the drain electrode;
an active layer with a predetermined pattern formed on the source electrode and the drain electrode;
a second insulating layer formed on the data line and the active layer, the second insulating layer has a through hole;
a pixel electrode formed on the second insulating layer, the pixel electrode is electrically connected with the drain electrode by the through hole in the second insulating layer, wherein a detecting portion extended from the pixel electrode is disposed over the data line;
a first insulating protective layer formed on the second insulating layer, the first insulating protective layer and the pixel electrode are disposed in the same layer;
a gate electrode layer formed on the first insulating protective layer;
a second insulating protective layer formed on the gate electrode layer and the pixel electrode, the second insulating protective layer has at least one via hole;
a common electrode and a detecting plate formed on the second insulating protective layer, the detecting plate is directly electrically connected with the detecting portion by the at least one via hole provided in the second insulating protective layer.

11. The array substrate according to claim 10, wherein the number of via hole is at least two.

12. The array substrate according to claim 11, wherein the via hole is filled with a connecting portion, which is integrally formed with the detecting plate.

* * * * *